United States Patent
Desai

(10) Patent No.: US 11,199,569 B2
(45) Date of Patent: Dec. 14, 2021

(54) DYNAMIC CONFIGURATION OF A TEST CHAMBER FOR WIRELESS COMMUNICATIONS

(71) Applicant: T-Mobile USA, Inc., Bellevue, WA (US)

(72) Inventor: Chirag Desai, Bellevue, WA (US)

(73) Assignee: T-Mobile USA, Inc., Bellevue, WA (US)

(*) Notice: Subject to any disclaimer, the term of this patent is extended or adjusted under 35 U.S.C. 154(b) by 229 days.

(21) Appl. No.: 16/240,188

(22) Filed: Jan. 4, 2019

(65) Prior Publication Data
US 2020/0217878 A1    Jul. 9, 2020

(51) Int. Cl.
| | |
|---|---|
| *G01R 29/08* | (2006.01) |
| *G01R 29/10* | (2006.01) |
| *H04B 17/29* | (2015.01) |
| *H01Q 17/00* | (2006.01) |
| *H04B 17/00* | (2015.01) |
| *H04W 24/06* | (2009.01) |

(52) U.S. Cl.
CPC ....... *G01R 29/0821* (2013.01); *G01R 29/105* (2013.01); *H01Q 17/008* (2013.01); *H04B 17/0085* (2013.01); *H04B 17/29* (2015.01); *H04W 24/06* (2013.01)

(58) Field of Classification Search
CPC .............. G01R 29/0821; G01R 29/105; H04B 17/0085; H04B 17/29; H04W 24/06
See application file for complete search history.

(56) References Cited

U.S. PATENT DOCUMENTS

| | | | |
|---|---|---|---|
| 7,167,682 B1* | 1/2007 | Madsen | H04B 17/15 455/115.1 |
| 9,214,718 B2* | 12/2015 | Mow | H01Q 5/328 |
| 10,644,811 B1* | 5/2020 | Cummings | H04B 17/17 |
| 2008/0125053 A1* | 5/2008 | Stojcevic | G01R 29/105 455/67.14 |
| 2009/0307763 A1* | 12/2009 | Rawlins | G06F 11/3672 726/5 |
| 2014/0187173 A1* | 7/2014 | Partee | H04L 43/045 455/67.12 |
| 2015/0109941 A1* | 4/2015 | Zhang | H04W 88/02 370/252 |
| 2018/0027434 A1* | 1/2018 | Foegelle | H04B 7/0617 455/67.13 |
| 2018/0049052 A1* | 2/2018 | Doshi | H04W 24/06 |

(Continued)

*Primary Examiner* — Devan A Sandiford
(74) *Attorney, Agent, or Firm* — Han Santos, PLLC

(57) ABSTRACT

A method for the dynamic configuration of a test chamber for wireless communications is provided. The method includes identifying a current test project to be performed on a test device. The test device is disposed within a test chamber for evaluating one or more interactions of the test device with a wireless communication network. The method also includes determining a test configuration of a wireless connection interface of the test chamber based on the identified current test project and then sending a control signal to the wireless connection interface to set the wireless connection interface to the test configuration. In operation, the test configuration of the wireless connection interface controls which of a plurality of wireless signals of the wireless communication network are emitted within an interior the test chamber.

12 Claims, 5 Drawing Sheets

(56) References Cited

U.S. PATENT DOCUMENTS

| | | | | |
|---|---|---|---|---|
| 2018/0123938 A1* | 5/2018 | Desai | ................ | H04L 65/1016 |
| 2019/0260488 A1* | 8/2019 | Emmanuel | ......... | H04B 17/0085 |
| 2019/0331718 A1* | 10/2019 | Cummings | ............ | G01R 29/10 |
| 2021/0096165 A1* | 4/2021 | Chew | ................ | G01R 29/0821 |
| 2021/0136867 A1* | 5/2021 | Duffy | .................... | H04W 76/15 |
| 2021/0144566 A1* | 5/2021 | Ng | ........................ | G16Y 40/10 |

* cited by examiner

DYNAMIC CONFIGURATION OF A TEST CHAMBER FOR WIRELESS COMMUNICATIONS

BACKGROUND

Wireless communication devices are integral to the daily lives of most users. Wireless communication devices are used to make voice calls, check email and text messages, update social media pages, stream media, browse websites, and so forth. In general, wireless communication devices utilize a wireless communication network provided by a mobile network operator (MNO) to facilitate the exchange of information in accordance with one or more wireless communication protocols. For example, an MNO may maintain a wireless communication network in which a set of mobile devices are configured to exchange information in accordance with a second-generation wireless communication protocol, such as the Global System for Mobile Communication wireless communication protocol (e.g., GSM). In another example, the MNO may maintain a wireless communication network in which mobile devices are configured to exchange information in accordance with a third generation or fourth generation wireless communication protocol such as the Wideband Code Division Multiple Access ("WCDMA") or Long-Term Evolution ("LTE") wireless communication protocols.

Through advancements in wireless access technologies, Internet Protocol (IP) based communications for multimedia applications became available for various types of mobile devices. Examples of such applications include Voice over LTE Network (VoLTE), Video over LTE (ViLTE), Rich Communication Services (RCS), Voice over Wi-Fi (Vo-WiFi), Voice over IP (VoIP), white board discussions, video conferencing, Push to talk over Cellular (PoC), real-time content sharing including videos/audio files, instant messaging, interactive gaming, and the like.

Accordingly, manufacturers of wireless communication devices are constantly developing new models in an attempt to provide users with new and improved capabilities. Thus, the users of wireless communication devices expect telecommunication carriers (i.e., MNOs) to provide constant and reliable telecommunication and data communication services that take advantage of these new capabilities.

BRIEF DESCRIPTION OF THE DRAWINGS

The detailed description is described with reference to the accompanying figures, in which the left-most digit(s) of a reference number identifies the figure in which the reference number first appears. The use of the same reference numbers in different figures indicates similar or identical items.

DETAILED DESCRIPTION

Figure 1:
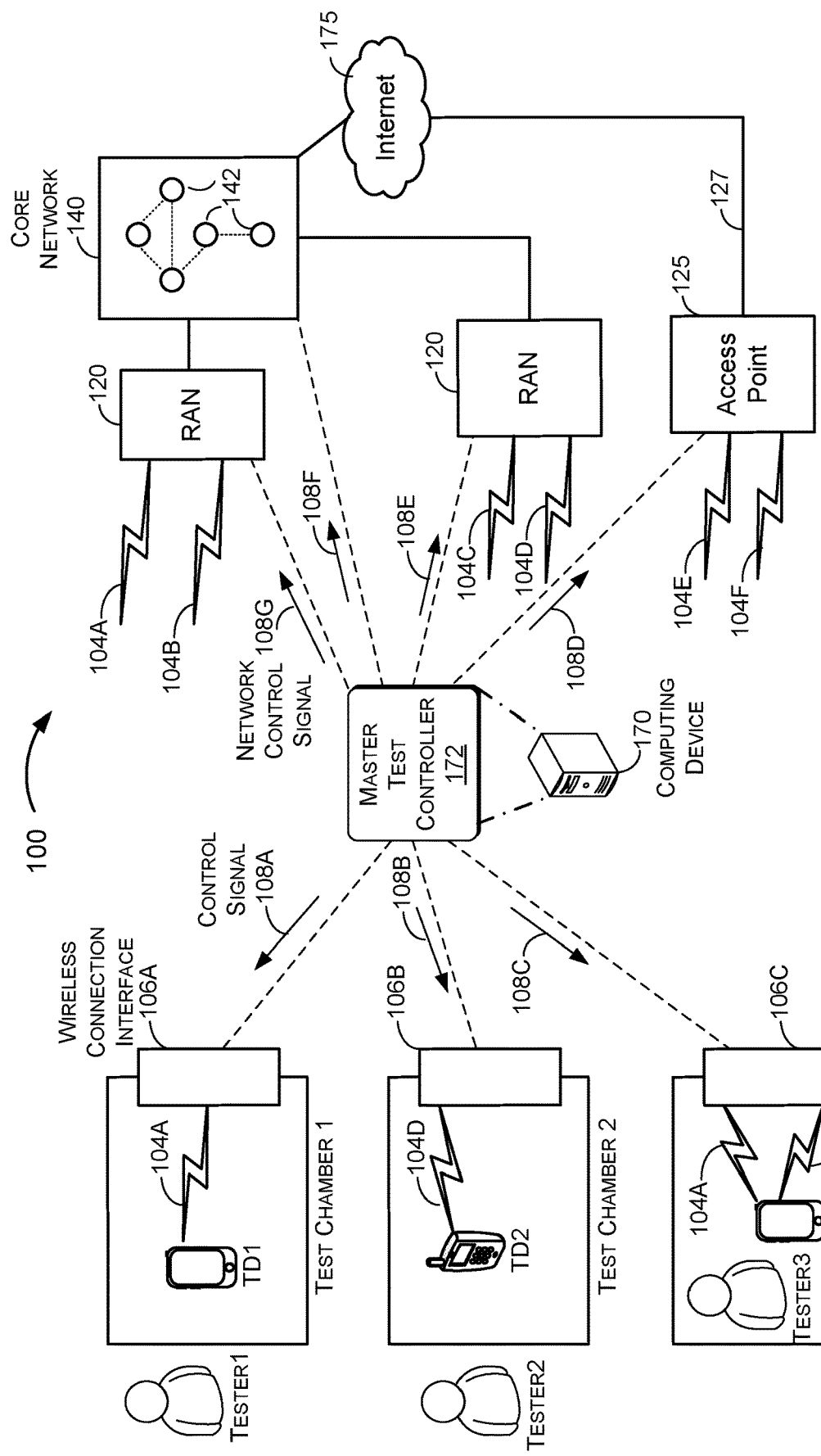
FIG. 1 illustrates several test chambers, each for evaluating interactions of a respective test device with a wireless communication network.

Mobile network operators (MNOs) are generally interested in controlling and improving the quality of communications over their wireless communication network. Accordingly, MNOs may employ test engineers, quality control testers, product testers, and the like (collectively referred to herein as 'Testers') to test physical user devices (i.e., test devices), applications, services, and the wireless communication network, itself. In order to test various aspects associated with the communications over the wireless communication network, different types of test devices may need to be configured in various ways, the wireless communication network, itself, may need to be configured in various ways, and various wireless signals may need to be modified (e.g., isolated, combined, conditioned, etc.) to serve as the basis for the tests.

Generally described, aspects of the present disclosure are directed to the testing of a test device's interactions with a wireless communication network. These interactions may include communications and/or data exchanges between the test device and the wireless communication network. In some aspects, the present disclosure relates to the automatic and dynamic configuration of a test chamber utilized for conducting the test. For example, in some aspects, the test chamber may be a room, box, or other enclosure in which the test device may be physically placed. Each test chamber may include a wireless connection interface for controlling which wireless signals are emitted within the test chamber. The wireless connection interface may also control which signals generated by the test device are allowed to pass through to an exterior of the test chamber. In addition, the wireless connection interface may perform one or more operations on the wireless signals, such as combining multiple wireless signals, attenuating or amplifying one or more wireless signals, simulating one or more wireless signals, delaying or otherwise modifying one or more wireless signals, etc., all for evaluating the test device's interaction with a wireless communication network.

As will be described in more detail below, some aspects of the present disclosure are directed to a computing device that implements a master test controller that implements one or more of the following functions: (1) the automatic and dynamic configuration of a test chamber and/or a wireless communication network based on an identification of a test project; (2) the application of machine learning techniques to identify recommended test projects to be performed by a tester; (3) the use of a central project database to coordinate multiple different test projects and/or identify relevant/inefficient tests cases; (4) the generation of standardized and automatic project reporting to allow managers, executives, engineers, etc., to perform queries of the centralized project database to obtain status and/or results of various test projects.

Accordingly, aspects of the present disclosure may provide for the quicker setup of a test project as compared to conventional test chamber that requires manual configuration by the tester. Furthermore, the dynamic and automatic configuration may allow for more test projects to be completed as a test chamber need not be maintained in a static configuration for an extended period of time where other test projects are prevented from being conducted within a manually configured test chamber. Even still aspects of the present disclosure provide for the automatic detection of conflicts between a current test project and another test project which may increase the reliability and/or diagnosis of the test results. All of the above may indirectly improve the performance of a wireless communication network operated by an MNO, as more test projects may be completed, in a shorter amount of time, and with more reliable results.

These and other aspects will be described in more detail below. The techniques described herein may be implemented in a number of ways. Example implementations are provided below with reference to the following figures.

Example Network Architecture

FIG. 1 illustrates several test chambers (e.g., test chamber 1, test chamber 2, and test chamber 3), each for evaluating interactions of a respective test device (e.g., TD1, TD2, and TD3) with a wireless communication network 100. As shown in FIG. 1, a tester (e.g., Tester1) may perform one or more test projects using a respective test device (i.e., TD1). Each test project may be directed to evaluating various aspects associated with the communications over the wireless communication network. For example, one test project may be to evaluate communication of a new or existing test device with the wireless communication network. Another test project may be to evaluate a certain feature and/or hardware of a test device with respect to its interaction with the wireless communication network. Yet another test project may be to evaluate one or more hardware (e.g., base station) changes and/or configurations of the wireless communication network itself.

The TDs 1, 2, and 3 may include cellular telephones, smartphones, tablets, smart watches, personal digital assistants (PDAs), pagers, a laptop computer, a desktop computer, and so on. For example, in FIG. 1, TDs 1 and 3 are illustrated as cellular touchscreen phones or smart phones and TD 2 is illustrated as a cellular calling phones.

Referring to FIG. 1, TDs 1, 2, and 3 are configured to communicate with an access network (e.g., the radio access networks (RANs) 120 and an access point 125, etc.) over a physical communications interface or layer, such as an air interface. The air interfaces may comply with a given cellular communications protocol, such as, Code Division Multiple Access (CDMA), Evolution Data-Optimized (EVDO), evolved High Rate Packet Data (eHRPD), Global System for Mobile communications (GSM), Enhanced Data rates for GSM Evolution (EDGE), Wideband CDMA (W-CDMA), Long Term Evolution (LTE), etc., while other air interfaces may comply with a wireless IP protocol (e.g., IEEE 802.11). The RANs 120 include a plurality of access points that serve TDs over air interfaces. The access points in the RANs 120 may be referred to as access nodes or ANs, access points or APs, base stations or BSs, Node Bs, eNode Bs, and so on. These access points can be terrestrial access points (or ground stations), or satellite access points. The RANs 120 are configured to connect to a core network 140 that can perform a variety of functions, including bridging circuit switched (CS) calls between TDs served by the RANs 120 and other devices served by the RANs 120 or a different RAN altogether, and can also mediate an exchange of packet-switched (PS) data with external networks such as Internet 175. The Internet 175 includes a number of routing agents and processing agents (not shown in FIG. 1 for the sake of convenience). In some aspects, the Internet 175 can function to bridge packet-switched data communications between various TDs and other devices via the core network 140. Also shown in FIG. 1 is the access point 125 that is separate from the RANs 120. The access point 125 may be connected to the Internet 175 independent of the core network 140 (e.g., via an optical communication system, a cable modem, etc.). The air interface utilized by access point 125 may serve a TD over a local wireless connection, such as IEEE 802.11, in an example. In some examples, access point 125 corresponds to a modem or router (e.g., for a Wi-Fi router with wired and/or wireless connectivity).

As shown in FIG. 1, the core network 140 may include one or more nodes 142. The one or more nodes 142 of the core network 140 may correspond to one or more servers and/or functions provided by the core network 140, such as a gateway, an IP multimedia subsystem (IMS), a Call Session Control Function (CSCF), a Mobility Management Entity (MME), a Home Subscriber Server (HSS), an event data recorder (EDR), a Telephone Application Server (TAS), and the like. As used herein, the term "component," as in "a component of the wireless communication network" may refer to any of the illustrated RANs 120, access point 125, core network 140, and/or any of the nodes 142.

As shown in FIG. 1, the RANs 120 and access point 125 may communicate with one or more wireless devices, such as TDs 1, 2, and 3, via one or more wireless signals, such as wireless signals 104A-F. The wireless signals 104A-F represent both uplink and downlink signals communicated with the wireless communication network 100. However, when performing some test projects on a test device (e.g., TD1) a tester may desire to limit and/or isolate one or more of the wireless signals 104A-F when evaluating the interactions between the test device and the wireless communication network 100. Accordingly, a test device may be disposed within a test chamber, such as test chambers 1-3, when performing the test project. In some examples, the test chambers 1-3 are radio frequency (RF) shielded areas (e.g., room, box, or other enclosure) for performing a test project on a test device in an RF-controlled environment. In some aspects, an interior and/or exterior surface of each of the test chambers 1-3 is covered with radiation absorbent material (RAM) that is configured to absorb RF radiation that is incident on the test chamber.

Each test chamber 1-3 further includes a corresponding wireless connection interface (e.g., wireless connection interfaces 106A-C). Each of the wireless connection interfaces 106A-C is configured to selectively control (e.g., gate) which of the wireless signals 104A-F generate by the wireless communication network 100 are allowed to pass through to within an interior of their respective test chambers 1-3. For example, as shown in FIG. 1, wireless connection interface 106A is currently configured to allow wireless signal 104A to be emitted within test chamber 1, while the remaining wireless signals (e.g., 104B-F) are prevented from being emitted within the test chamber 1. Similarly, wireless connection interface 106B is currently configured to allow wireless signal 104D to be emitted within test chamber 2, while the remaining wireless signals (e.g., 104A-C and E-F) are prevented from being emitted within the test chamber 2. Lastly, the wireless connection interface 106C is currently configured to allow both wireless signals 104A and 104E to be emitted within the test chamber 3, whereas wireless signals 104B, C, and F are prevented from being emitted within test chamber 3.

In addition to controlling which wireless signals are emitted within a test chamber, the wireless connection interfaces 106A-C may also be configured to selectively control which wireless signals are allowed to be transmitted by the test devices out to an exterior of a respective test chamber. Even still, the wireless connection interfaces 106A-C may perform one or more additional operations on the wireless signals, such as combining multiple wireless signals, attenuating or amplifying one or more wireless signals, simulating one or more other wireless signals, and/or delaying or otherwise modifying one or more of the wireless signals 104A-F.

In some aspects, the operation of the wireless connection interfaces 106A-C are performed in accordance with a respective test configuration. Accordingly, aspects of the present disclosure include a computing device 170 that includes a master test controller 172. The master test controller 172 is configured to control the test chambers 1-3 and their respective wireless connection interfaces 106A-C. For example, as shown in FIG. 1, the master test controller 172 may send a control signal 108A to wireless connection interface 106A to set the wireless connection interface 106A to a first test configuration that includes allowing wireless signal 104A to be emitted within test chamber 1. Similarly, the master test controller 172 may send a control signal 108B to the wireless connection interface 106B to set the wireless connection interface 106B to a second test configuration that includes allowing wireless signal 104D to be emitted within test chamber 2. Also shown in FIG. 1 is the master test controller 172 sending a configuration signal 108C to the wireless connection interface 106C to set the wireless connection interface 106C to a third test configuration that includes allowing both wireless signals 104A and 104E to be emitted within test chamber 3.

In addition, the master test controller 172 may be configured to control one or more components (e.g., RANs 120, access point 125, core network 140, nodes 142, etc.) of the wireless communication network 100. For example, as shown in FIG. 1, master test controller 172 may send a network control signal 108G to RAN 120 to change one or more parameters of the RAN 120. Similarly, the master test controller 172 may send a network control signal 108F to a node 142 of the core network 140 to change one or more parameters of the node 142. Similar network control signals 108D and 108E may be sent by the master test controller 172 to other components of the wireless communication network 100 to change parameters of these other components. In some examples, the parameter changes may include enabling or disabling certain services and/or functions provided by the wireless communication network 100, changing the timing and/or other parameters of the wireless signals 104A-F, changing routing preferences, etc.

In some examples, computing device 170 may be connected to the Internet 175, the core network 140, a local network, and/or directly to the wireless connection interfaces 106A-C. The computing device 170 may be implemented as a plurality of structurally separate servers, or alternately may correspond to a single server.

Example Computing Device Components

Figure 2:
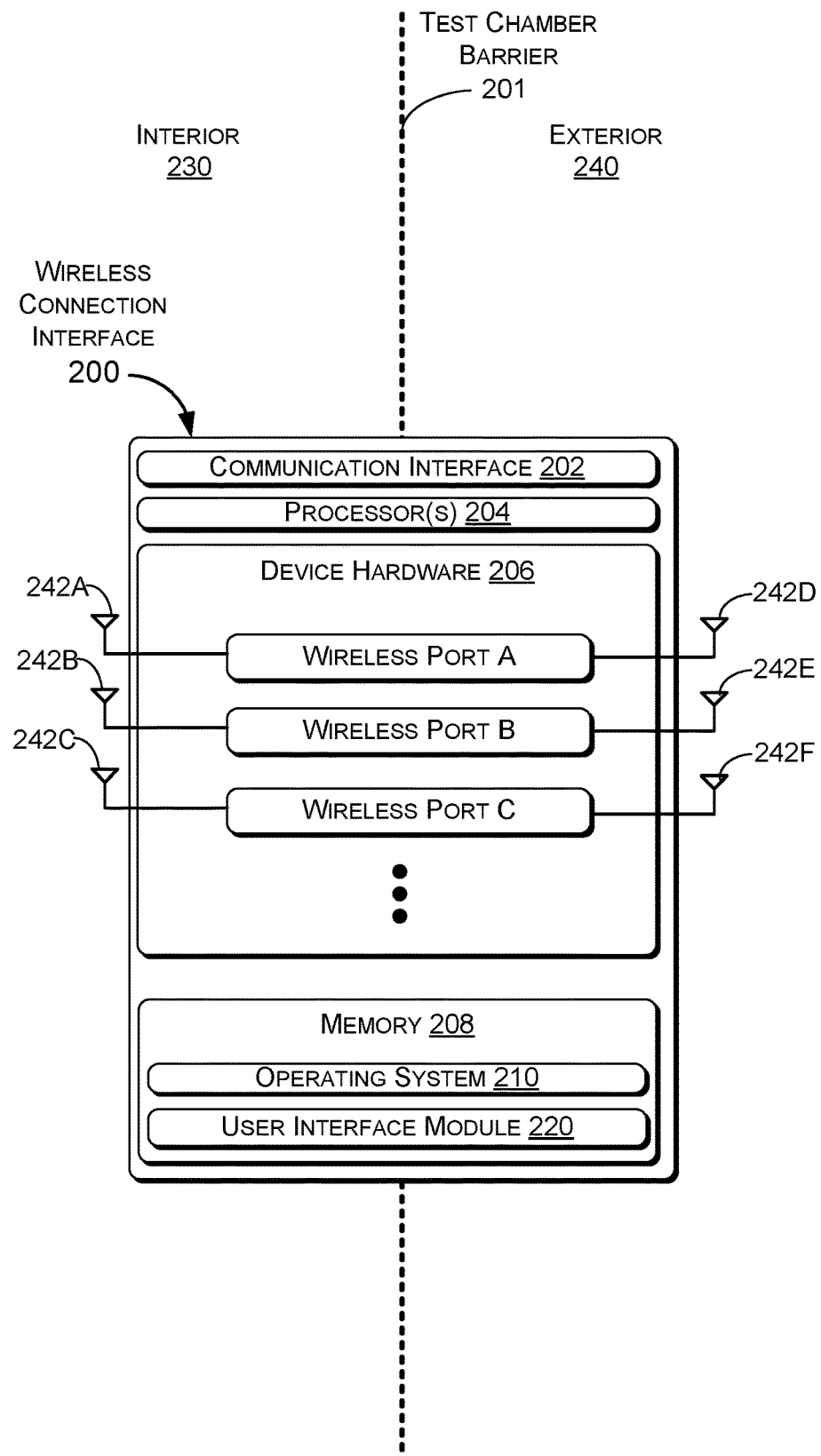
FIG. 2 is a block diagram of a wireless connection interface for use with a test chamber.

FIG. 2 is a block diagram of a wireless connection interface 200 for use with a test chamber. The wireless connection interface 200 of FIG. 2 is one possible implementation of any of the wireless connection interfaces 106A-C of FIG. 1. As shown in FIG. 2, the wireless connection interface 200 may include a communication interface 202, one or more processors 204, device hardware 206, and a memory 208. Also shown in FIG. 2 is a test chamber barrier 201 that separates an interior 230 of a respective test chamber from an exterior 240 of the test chamber. In some examples, test chamber barrier 201 may be a wall, lining, or RAM, of a test chamber.

The communication interface 202 may include wireless and/or wired communication components that enable the wireless connection interface 200 to transmit data to and receive data from other networked devices (e.g., master test controller 172) via a communication network. For example, the communication interface 202 may be configured to communicate with the master test controller 172 to receive one or more control signals (e.g., control signal 108A) and/or to transmit results of one or more test projects to the master test controller 172.

The device hardware 206 may include one or more wireless ports, such as wireless ports A-C. In some aspects, each wireless port may be coupled to one or more antennas on the exterior 240 of the test chamber as well as to a corresponding one or more antennas on the interior 230 of the test chamber. For example, wireless port A is illustrated as being coupled to antenna 242A on the interior 230 and to antenna 242D on the exterior 240. Similarly, wireless port B is illustrated as coupled to antenna 242B on the interior 230 and to antenna 242E on the exterior 240. Wireless port C is illustrated as coupled to antenna 242C on the interior 230 and to antenna 242F on the exterior 240. Although FIG. 2 illustrates device hardware 206 as including three wireless ports, in other implementations device hardware 206 may include one or more wireless ports. The wireless ports A-C are configured to perform one or more operations with regard to wireless signals (e.g., wireless signals 104A-F) received at and/or transmitted from the wireless connection interface 200. Each of the wireless ports A-C may include one or more active and/or passive hardware components for performing the operations on the wireless signals. For example, the wireless ports A-C may each include a wireless transmitter, a wireless receiver, one or more switches, amplifiers, multiplexers, attenuators, filters, signal generators, and the like for performing one or more signal processing functions on the wireless signals 104A-F. As will be described in more detail below, each of the wireless ports A-C may perform a respective operation on the wireless signals 104A-F based on a respective test configuration received via a control signal (e.g., control signal 108A) at the communication interface 202. For example, a control signal may designate a first test configuration that disables wireless port A from emitting any wireless signals via antenna 242A within the interior 230 of the test chamber. The first test configuration may also enable wireless port B to allow wireless signals received at antenna 242E at the exterior 240 to pass through to antenna 242B to within the interior 230 of the test chamber. As yet another example, the first test configuration may set the wireless port C to attenuate wireless signals received at the antenna 242F before being emitted via antenna 242C within the interior 230.

The memory 208 may be implemented using computer-readable media, such as computer storage media. Computer-readable media includes, at least, two types of computer-readable media, namely computer storage media and communications media. Computer storage media includes volatile and non-volatile, removable and non-removable media implemented in any method or technology for storage of information such as computer-readable instructions, data structures, program modules, or other data. Computer storage media includes, but is not limited to, RAM, ROM, EEPROM, flash memory or other memory technology, CD-ROM, digital versatile disks (DVD) or other optical storage, magnetic cassettes, magnetic tape, magnetic disk storage or other magnetic storage devices, or any other non-transmission medium that can be used to store information for access by a computing device. In contrast, communication media may embody computer-readable instructions, data structures, program modules, or other data in a modulated data signal, such as a carrier wave, or other transmission mechanisms.

The processors 204 and the memory 208 of the wireless connection interface 200 may implement an operating system 210 and the user interface module 220. The operating system 210 may include components that enable the wireless connection interface 200 to receive and transmit data via various interfaces (e.g., user controls, communication interface, and/or memory input/output devices), as well as process data using the processors 204 to generate output. Additionally, the operating system 210 may include other components that perform various additional functions generally associated with an operating system. The user interface module 220 may include a presentation component that presents the output (e.g., display the data on an electronic display, store the data in memory, transmit the data to another electronic device, etc.). In some examples, the user interface module 220 may present an output indicating the current configuration of the wireless ports A-C.

Figure 3:
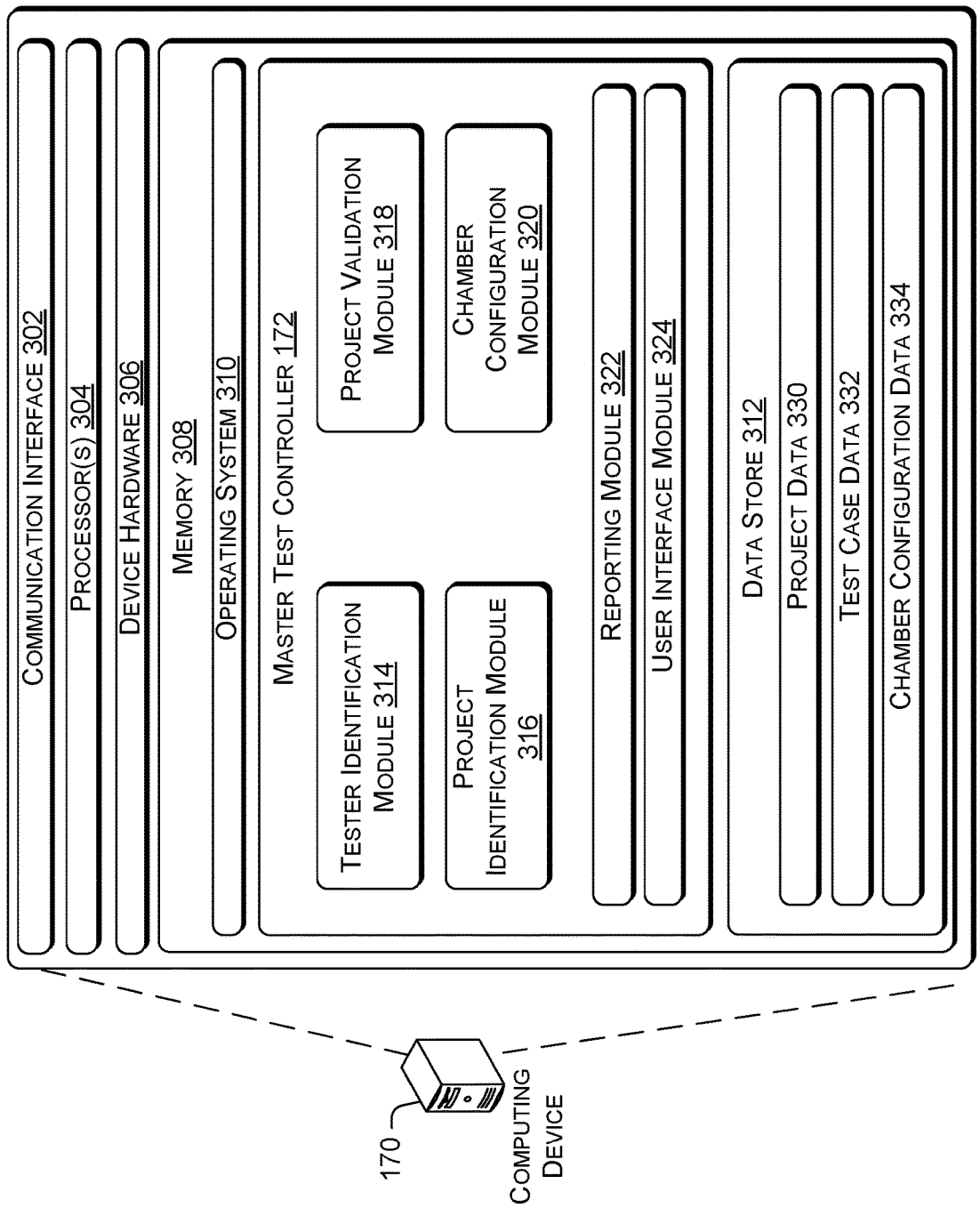
FIG. 3 is a block diagram of a computing device that includes a master test controller for implementing the dynamic configuration of a test chamber.

FIG. 3 is a block diagram of a computing device 170 that includes a master test controller 172 for implementing the dynamic configuration of a test chamber.

In some examples, the master test controller 172 may be implemented on one or more computing devices that are a part of the core network 140. The computing device 170 may include general purpose computers, such as desktop computers, tablet computers, laptop computers, servers, or other electronic devices that are capable of receiving inputs, processing the input, and generating output data. In other embodiments, the computing device 170 may be virtual computing device in the form of virtual machines or software containers that are hosted in a cloud. The computing devices 170 may be equipped with a communication interface 302, one or more processors 304, device hardware 306, and memory 308. The communication interface 302 may include wireless and/or wired communication components that enable the computing device 170 to transmit data to and receive data from other networked devices via a communication network. The device hardware 306 may include additional hardware that performs user interface, data display, data communication, data storage, and/or other server functions.

The memory 308 may be implemented using computer-readable media, such as computer storage media. Computer-readable media includes, at least, two types of computer-readable media, namely computer storage media and communications media. Computer storage media includes volatile and non-volatile, removable and non-removable media implemented in any method or technology for storage of information such as computer-readable instructions, data structures, program modules, or other data. Computer storage media includes, but is not limited to, RAM, ROM, EEPROM, flash memory or other memory technology, CD-ROM, digital versatile disks (DVD) or other optical storage, magnetic cassettes, magnetic tape, magnetic disk storage or other magnetic storage devices, or any other non-transmission medium that can be used to store information for access by a computing device. In contrast, communication media may embody computer-readable instructions, data structures, program modules, or other data in a modulated data signal, such as a carrier wave, or other transmission mechanism.

The processors 304 and the memory 308 of the computing device 170 may implement the master test controller 172 and a data store 312. The master test controller 172 may include a tester identification module 314, a project identification module 316, a project validation module 318, a chamber configuration module 320, a reporting module 322, and a user interface module 324.

The tester identification module 314, project identification module 316, project validation module 318, chamber configuration module 320, reporting module 322, and user interface module 324 may interact with the data store 222 to save and/or retrieve various data. These modules may include routines, program instructions, objects, and/or data structures that perform particular tasks or implement particular abstract data types.

In some aspects, the tester identification module 314 is configured to obtain an identity of a tester (e.g., tester 1) who will be performing a test project on one or more test devices (e.g., TD1). In some examples, the tester identification module 314 may interact with the user interface module 324 to present a user interface component to the tester to allow the tester to enter a unique identification (ID) of the tester. In other examples, the tester identification module 314 may obtain one or more biometric identifiers of the tester in order to identify the tester utilizing one or more biometric identification techniques (e.g., facial recognition, fingerprint identification, voice identification, etc.).

The project identification module 316 is configured to identify a current test project to be performed on a test device (e.g., TD1). In some aspects, project identification module 316 identifies the current test project based on the identity of the tester 1 obtained by the tester identification module 314. For example, project identification module 316 may obtain the identity of the tester 1 and then query the project data 330, included in data store 312, to determine one or more test projects that are associated with the tester. In some examples, the project identification module 316 may then present the one or more test projects via the user interface module 324 to allow the tester to select a test project that the tester 1 desires to perform. In some aspects, the tester may select one of the available test projects or may create a new test project to perform.

The project validation module 318 may be configured to determine an efficacy of a test project to be performed by the tester. For example, aspects of the present disclosure include maintaining project data 330 in data store 312, that provides a centralized database for all test projects currently in progress, previous test projects, as well as test projects that are scheduled or expected to be performed in the future. Accordingly, the project validation module 318 may determine whether a current test project to be performed by the tester conflicts and/or interferes with one or more other test projects included in the project data 330. By way of example, the project validation module 318 may identify a test project being performed in another test chamber (e.g., test chamber 2) that includes a particular configuration of RAN 120. If that particular configuration would interfere (e.g., prevent, skew, conflict, etc.) with the current test project to be performed by tester, then the project validation module 318 may alert the tester to that effect (e.g., via user interface module 324).

In other aspects, the project validation module 318 determining the efficacy of the current test project may include determining a future operational status of the wireless communication network 100. For example, the project validation module 318 may determine that there is maintenance currently being performed (or scheduled to be performed) on one or more of the RANs 120 that would prevent, or otherwise interfere, with the performance of the current test project. Accordingly, if the current/scheduled maintenance would interfere with the current test project to be performed by tester, then the project validation module 318 may alert the tester to that effect (e.g., via user interface module 324).

In addition to alerting the tester of the potential conflict between the current test project and another test project, the project validation module 318 may provide a recommendation of one or more other test projects that may be performed by the tester that do not have a conflict. In some examples, the recommendation of the one or more other test projects may include applying one or more machine learning techniques to the data store 312 to identify the one or more other non-conflicting test projects.

The chamber configuration module 320 is configured to determine a test configuration of a wireless connection interface (e.g., wireless connection interface 106A) based on the current test project. In some examples, a test project may include one or more test cases, where a test case is a sequence of one or more tests to perform with a test device (e.g., TD1) and the wireless communication network 100. Various test cases may be stored in the data store 312 as test case data 332. By way of example, a test project to evaluate an integrated circuit modem of a test device may include a first test case to evaluate communication between the integrated circuit modem and a RAN 120 via a first radio access technology (RAT), such as LTE. A second test case included in the test project may include a sequence of tests to evaluate communication between the integrated circuit modem and the access point 125 via a second RAT, such as Wi-Fi.

Accordingly, the chamber configuration module 320 may determine a test configuration of the wireless connection interface 106A based on the test cases included in the test project (e.g., enable the wireless signal 104A to be emitted within the test chamber 1 to allow LTE communication and enable the wireless signal 104E to be emitted within the test chamber 1 to allow Wi-Fi communications). The chamber configuration module 320 may then generate and send a control signal 108A to the wireless connection interface 106A to set the wireless connection interface 106A to the test configuration.

In addition to setting the wireless connection interface 106A to the test configuration, the chamber configuration module 320 may also determine a network test configuration of at least one component of the wireless communication network 100. Thus, the chamber configuration module 320 may generate and send one or more network control signals (108D-G) to one or more components of the wireless communication network 100 to set/change one or more parameters of the wireless communication network 100. For example, in response to identifying the current test project, including the one or more test cases, the chamber configuration module 320 may determine that one or more parameters of the wireless communication network 100 may need to be changed. Continuing with the example above, where a test case involves evaluating Wi-Fi communications, the chamber configuration module 320 may send the network control signal 108D to access point 125 to change one or more parameters of the access point 125 (e.g., change one or more channels of the access point 125, bandwidth, signal strength, etc.).

In some examples, test chambers 1, 2, and 3 are co-located (e.g., located within the same building). Accordingly, the master test controller 172 may provide an indication (e.g., via user interface module 324) to the tester 1 of which of the test chambers has been assigned to perform the test project. The tester 1 may then dispose (e.g., place) the TD1 in the interior of the assigned and configured test chamber (e.g., test chamber 1) to perform the test project. In some examples, performing the test project includes the TD1 exchanging one or more messages with the wireless communication network 100 via the wireless connection interface 106A. The evaluation of the communication between the TD1 and the wireless communication network 100 may be performed by software installed on the TD1, itself, by additional monitoring hardware included in the test chamber 1, by the wireless connection interface 106A, by one or more components of the wireless communication network 100, and/or by the tester 1.

In some examples, the results of the test project may include one or more metrics that measure a performance (e.g., key performance indicators, Quality of Experience, etc.) of the TD1 and/or of the wireless communication network 100 during the test project. The results may be obtained by the master test controller 172 upon completion of the project and/or in real-time as various test cases are performed. In some examples, the mater test controller 172 may obtain the results via a communication network, such as a Wi-Fi network, an ethernet connection, a local-area connection, the Internet 175, and the like. As mentioned above, the results may be generated by one or more components involved in the test project, such as the test device itself, the wireless connection interface, additional monitoring hardware included in the test chamber, the RANs 120, the access point 125, and/or the core network 140 including the one or more nodes 142.

In some examples, the master test controller 172 may identify one or more additional test cases to include the current test project based on the results. For example, results that indicate poor performance of the TD1 while performing simultaneous communication via LTE and Wi-Fi may prompt another test case that tests simultaneous communication via LTE and Bluetooth. In some aspects, the identification of one or more additional test cases to include in the test project may include applying one or more machine learning techniques to the results and the project data 330 and/or test case data 332.

As mentioned above, the configuration of the wireless connection interface 106A and/or the wireless communication network 100 may be dynamic. Thus, in some examples, the chamber configuration module 320 may be configured to send an additional control signal 108A to the wireless connection interface 106A during the performance of a test project (e.g., prior to completion of the test project). For example, upon completion of a test case to evaluate LTE communications, the master test controller 172 may send another control signal 108A to the wireless connection interface 106A to prevent LTE signals from being emitted within the interior of the test chamber 1 and to enable Wi-Fi signals to be emitted within the test chamber 1 to allow a subsequent test case for evaluating Wi-Fi communications of the TD1.

Once a test project is completed or ceased, the chamber configuration module 320 may send another control signal 108A to the wireless connection interface 106A to switch the wireless connection interface 106A from the test configuration to a default configuration. In some examples, the default configuration may include disabling all wireless signals 104A-F incident on an exterior of the test chamber from being passed through (e.g., emitted into) to an interior of the test chamber 1. In other examples, the default configuration may include enabling all wireless signals 104A-F to be emitted within the test chamber 1. In addition, the chamber configuration module 320 may send another network control signal (i.e., network control signals 108D-G) to one or more components of the wireless communication network 100 to revert the changes made to the one or more parameters.

The reporting module 322 is configured to generate one or more standard-formatted reports based on the results obtained via one or more test projects. In one implementation, the reporting module 322 may receive a request for information from a requesting device associated with a user, such as an engineer, a tester, a manager, etc. The request for information may include an indication of the type of results that are desired. For example, a request for information may include a request for all results related to use of a particular type of wireless device, results related to a particular technology utilized by the wireless communication network 100, a development program of the MNO, operations of one or more hardware components of a particular test device, operations of one or more hardware components of the wireless communication network 100, or a project ID of a test project.

The reporting module 322 may then query the data store 312 to obtain one or more results of various test projects related to the indication included in the request (e.g., obtain all results related to the use of a particular device's interaction via LTE). The reporting module 322 may then format the one or more results according to a standard model (e.g., template) to obtain a standard-formatted report that includes the one or more results. The standard-formatted report may then be forwarded to the requesting device via communication interface 302.

In some examples, the tester identification module 314, the project identification module 316, the project validation module 318, the chamber configuration module, and/or the reporting module 322 may implement one or more machine learning techniques that are supervised, unsupervised, or include reinforcement learning techniques. Examples of supervised learning techniques include K-nearest neighbor (KNN), Naive Bayes, logistic regression, support vector machine (SVM), and others. Other supervised learning analysis techniques include linear or polynomial regression analysis, decision tress analysis, and random forests analysis. Examples of unsupervised learning analysis techniques include association analysis, clustering analysis, dimensionality reduction analysis, hidden Markov model analysis techniques, and others. Examples of clustering analysis techniques include K-means, principal component analysis (PCA), singular value decomposition (SVD), incremental clustering, and probability-based clustering techniques. The reinforcement learning technique may be, for example, a Q-learning analysis technique. The techniques described above are some examples of machine learning techniques that may be utilized by the computing device 170 to generate clustered features and/or to identify a tester, identify a current test project, validate a current test project, identify one or more test cases to include in the current test project, determine a test configuration of one or more wireless connection interfaces, and/or identify the one or more results to include in the standard-formatted report. These are not intended to be limiting.

The data store 312 may store data that are used by the various modules of the master test controller 172. The data store 222 may include one or more databases, such as relational databases, object databases, object-relational databases, and/or key-value databases. In various embodiments, the data store 222 may store the project data 330 that includes various current and future test projects, test case data 332 that includes various test cases that may be included in one or more test projects, and chamber configuration data 334 that includes current and/or future test configurations.

Example Processes

Figure 4:
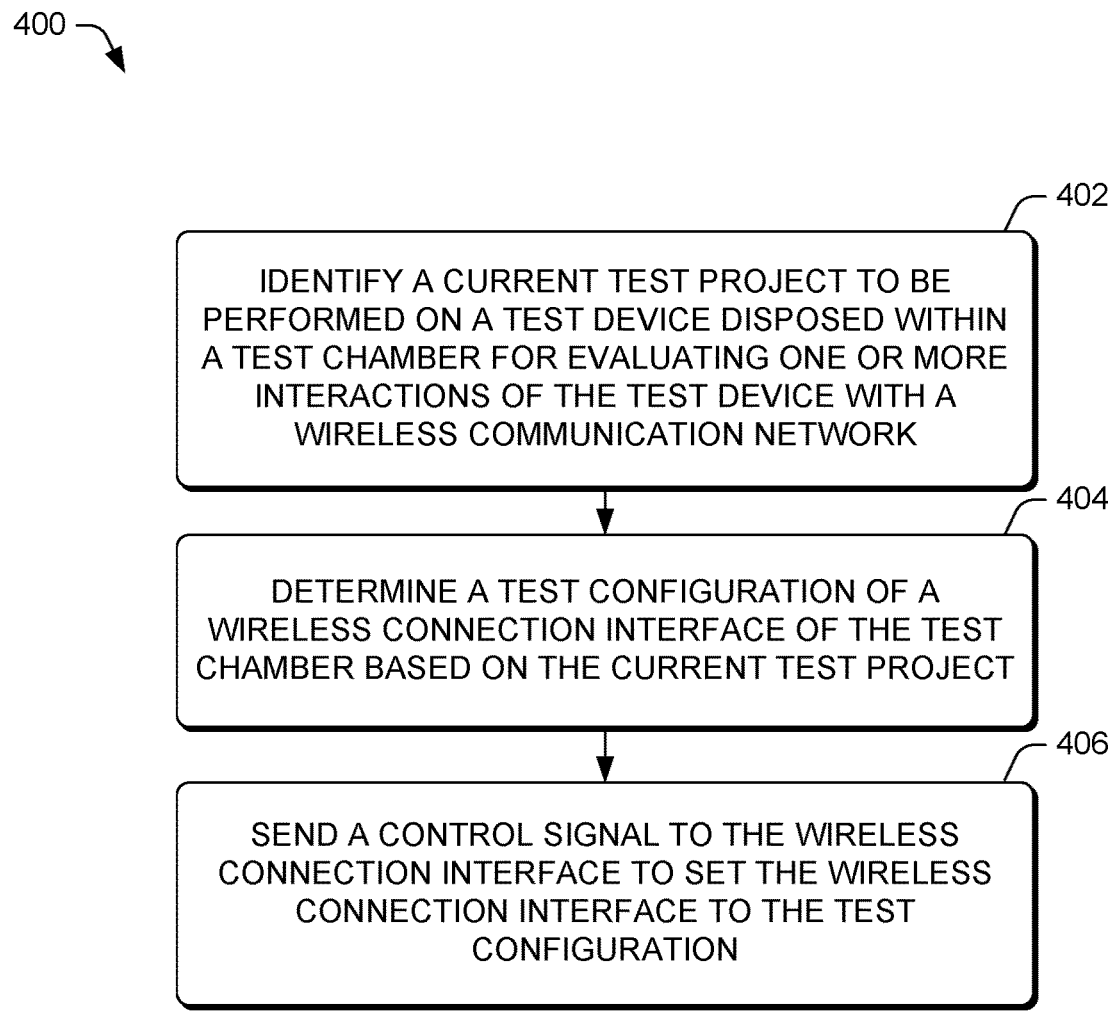
FIG. 4 is a flow diagram of an example process for the dynamic configuration of a test chamber.

FIG. 4 is a flow diagram of an example process 400 for the dynamic configuration of a test chamber. Process 400 is illustrated as a collection of blocks in a logical flow chart, which represents a sequence of operations that can be implemented in hardware, software, or a combination thereof. In the context of software, the blocks represent computer-executable instructions that, when executed by one or more processors, perform the recited operations. Generally, computer-executable instructions may include routines, programs, objects, components, data structures, and the like that perform particular functions or implement particular abstract data types. The order in which the operations are described is not intended to be construed as a limitation, and any number of the described blocks can be combined in any order and/or in parallel to implement the process. Process 400 is one example process that may be performed by the master test controller 172 and thus, is described with reference to FIGS. 1, 3, and 4.

In process block 402, the project identification module 316 identifies a current test project to be performed on a test device (e.g., TD1) that is to be disposed in a test chamber (e.g., test chamber 1) for evaluating one or more interactions of the test device with the wireless communication network 100. As mentioned above, in some examples, identification of the current test project may be based on the identity of the tester who will be performing the test project (e.g., determined by tester identification module 314). In a process block 404, the chamber configuration module 320 determines a test configuration of the wireless connection interface 106A based on the current test project. Next in process block 406, the chamber configuration module 320 sends a control signal 108A to the wireless connection interface 106A to set the wireless connection interface 106A to the test configuration.

Figure 5:
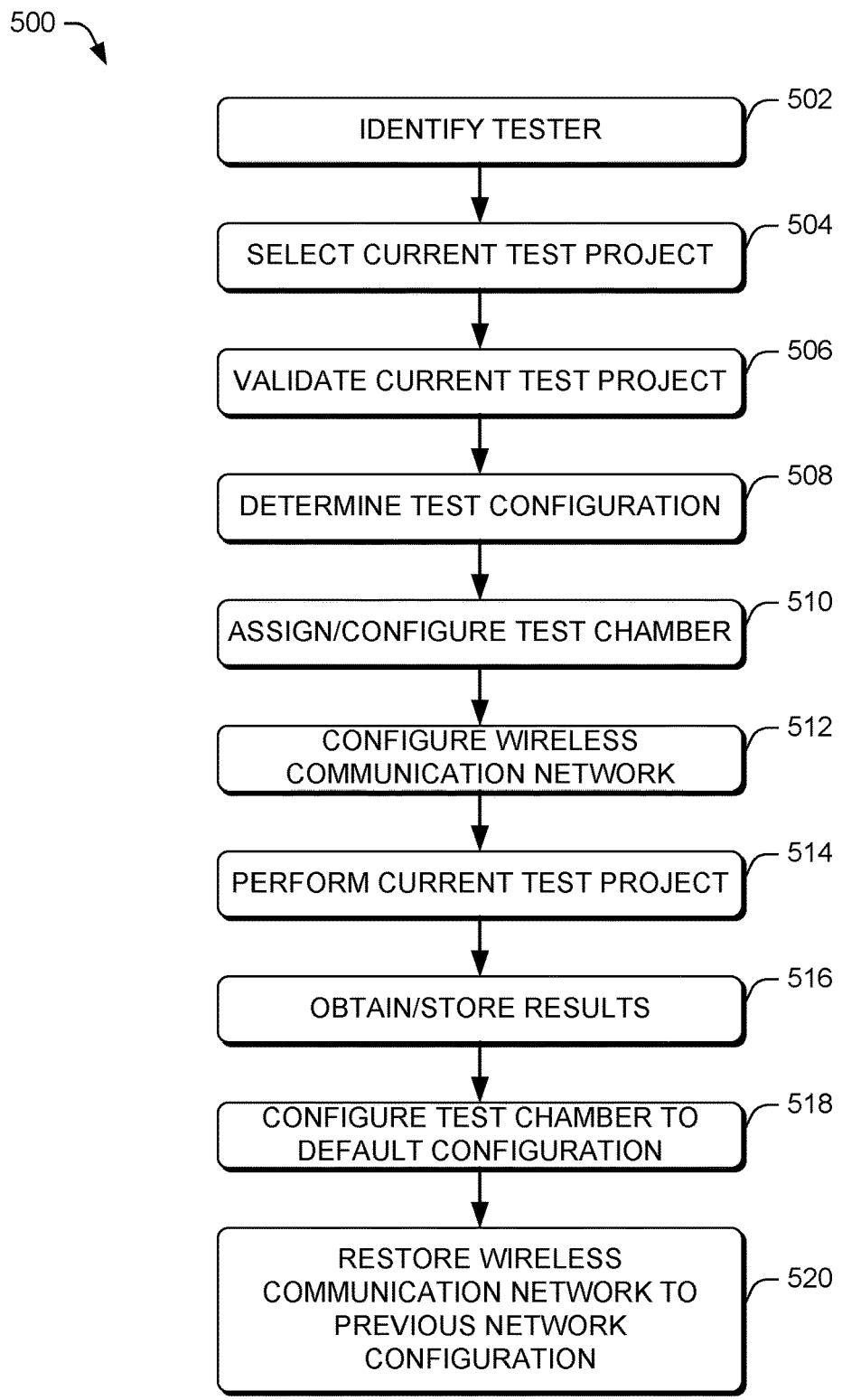
FIG. 5 is a flow diagram of another example process for the dynamic configuration of a test chamber.

FIG. 5 is a flow diagram of an example process 500 for the dynamic configuration of a test chamber. Process 500 is illustrated as a collection of blocks in a logical flow chart, which represents a sequence of operations that can be implemented in hardware, software, or a combination thereof. Process 500 is one example process that may be performed by the master test controller 172 and thus, is described with reference to FIGS. 1, 3, and 5.

In process block 502, the tester identification module 314 obtains an identity of a tester who will be performing a test project. As mentioned above, this may include receiving a user ID and/or receiving one or more biometric identifiers of the tester (e.g., tester 1). Next, in process block 504, the project identification module 316 selects a current test project to be performed by the tester. As mentioned above, the selection of the current test project may be determined, based in part, on the identity of the tester.

In a process block 506, the current test project is validated by projected validation module 318. In some examples, a current test project is validated if it does not conflict with another test project currently being performed in another test chamber or with another test project that is schedule to be performed in another test chamber. The current test project may also be validated if it does not conflict with a current or future operational status of the wireless communication network 100. As mentioned above, if the current test project is not validated (e.g., poor efficacy) then the project validation may provide a recommendation of one or more other test projects that may be performed by the tester.

In process block 508, the chamber configuration module 320 determines a test configuration for wireless connection interface 106A based on the current test project. In some examples, determining the test configuration includes retrieving one or more test configurations associated with the test project based on data included in the data store 312.

In some aspects, determining the test configuration may include dynamically determining one or more test configurations based on previous/other test projects that may include similar or the same test cases.

In a process block 510, the chamber configuration module 320 sends a control signal 108A to the wireless connection interface 106A to assign and configure a test chamber (e.g., test chamber 1) for the current test project. In process block 512, the chamber configuration module 320 may also send a network control signal (e.g., 108D-G) to change one or more parameters of one or more components of the wireless communication network 100.

Next, in process block 514, the current test project is performed with a test device (e.g., TD1) disposed within the test chamber. As mentioned above, performing the test project may include evaluating one or more interactions between the test device and the wireless communication network 100, that may include the exchange one or more messages.

In process block 516, the master test controller 172 receives the results of the current test project (e.g., via communication interface 302) and stores the results to data store 312. Next, in process block 518, upon determining that the current test project has ceased and/or is completed, the chamber configuration module 320 sends another control signal 108A to the wireless connection interface 106A to configure the test chamber to a default configuration. In addition, the chamber configuration module 320 may send another network control signal to the one or more components of the wireless communication network 100 to restore the wireless communication network 100 to a previous network configuration (e.g., undo the previously changed parameters).

CONCLUSION

Although the subject matter has been described in language specific to structural features and/or methodological acts, it is to be understood that the subject matter defined in the appended claims is not necessarily limited to the specific features or acts described. Rather, the specific features and acts are disclosed as exemplary forms of implementing the claims.

What is claimed is:

1. A computer-implemented method, comprising:
   identifying a current test project to be performed on a test device disposed within a test chamber for evaluating one or more interactions of the test device with a wireless communication network;
   determining a test configuration of a wireless connection interface of the test chamber based on the current test project; and
   sending a control signal to the wireless connection interface to set the wireless connection interface to the test configuration, wherein the test configuration of the wireless connection interface controls which of a plurality of wireless signals of the wireless communication network are emitted within an interior the test chamber.

2. The computer-implemented method of claim 1, wherein the current test project includes at least one test case that includes a sequence of one or more tests to perform with the test device and the wireless communication network, the method further comprising:
   applying one or more machine learning techniques to a data store of other test projects to identify one or more additional test cases to include in the current test project.

3. The computer-implemented method of claim 1, further comprising:
   determining a network test configuration of at least one component of the wireless communication network based on the current test project; and
   sending a network control signal to the at least one component to change at least one parameter of the at least one component based on the network test configuration.

4. The computer-implemented method of claim 1, further comprising:
   performing at least a portion of the current test project for evaluating the one or more interactions of the test device with the wireless communication network; and
   sending another control signal to the wireless connection interface to switch the wireless connection interface from the test configuration to a default configuration in response to determining that the current test project has completed or ceased.

5. The computer-implemented method of claim 1, further comprising:
   performing at least a portion of the current test project for evaluating the one or more interactions of the test device with the wireless communication network; and
   receiving one or more results of the current test project.

6. The computer-implemented method of claim 5, further comprising:
   applying one or more machine learning techniques to the one or more results to identify one or more additional test cases to include in the current test project.

7. The computer-implemented method of claim 5, further comprising:
   receiving a request for information from a requesting device, wherein the request for information includes at least one indication of: (1) a technology utilized by the wireless communication network, (2) a development program of a mobile network operator (MNO) of the wireless communication network, (3) one or more hardware components of the test device, (4) one or more hardware components of the wireless communication network, or (5) a project ID of the current test project;
   querying a datastore based on the indication included in the request to obtain the one or more results of the test project;
   formatting the one or more results according to a standard model to obtain a standard-formatted report that includes the one or more results; and
   forwarding the standard-formatted report to the requesting device.

8. The computer-implemented method of claim 5, wherein performing the current test project comprises the test device exchanging one or more messages with the wireless communication network via the wireless connection interface.

9. One or more non-transitory computer-readable media storing computer-executable instructions, which when executed by at least one processor, direct the at least one processor to:
   identify a current test project to be performed on a test device disposed within a test chamber for evaluating one or more interactions of the test device with a wireless communication network;
   determine a test configuration of a wireless connection interface of the test chamber based on the current test project; and send a control signal to the wireless connection interface to set the wireless connection interface to the test configuration, wherein the test configuration of the wireless connection interface controls which of a plurality of wireless signals of the wireless communication network are emitted within an interior of the test chamber.

10. The one or more non-transitory computer-readable media of claim 9, wherein the current test project includes at least one test case that includes a sequence of one or more tests to perform with the test device and the wireless communication network, wherein the computer-executable instructions further direct the at least one processor to:

apply one or more machine learning techniques to a data store of other test projects to identify one or more additional test cases to include in the current test project.

11. The one or more non-transitory computer-readable media of claim 9, wherein the computer-executable instructions further direct the at least one processor to:

determine a network test configuration of at least one component of the wireless communication network based on the current test project; and send a network control signal to the at least one component to change at least one parameter of the at least one component based on the network test configuration.

12. A computing device, comprising:

at least one processor; and at least one memory coupled to the at least one processor, the at least one memory having instructions stored therein, which when executed by the at least one processor, direct the computing device to:

identify a current test project to be performed on a test device disposed within a test chamber for evaluating one or more interactions of the test device with a wireless communication network;

determine a test configuration of a wireless connection interface of the test chamber based on the current test project; and send a control signal to the wireless connection interface to set the wireless connection interface to the test configuration, wherein the test configuration of the wireless connection interface controls which of a plurality of wireless signals of the wireless communication network are emitted within an interior the test chamber.

* * * * *